United States Patent
Brodsky et al.

(10) Patent No.: US 8,809,152 B2
(45) Date of Patent: Aug. 19, 2014

(54) GERMANIUM OXIDE FREE ATOMIC LAYER DEPOSITION OF SILICON OXIDE AND HIGH-K GATE DIELECTRIC ON GERMANIUM CONTAINING CHANNEL FOR CMOS DEVICES

(75) Inventors: MaryJane Brodsky, Salt Point, NY (US); Murshed M. Chowdhury, Newburgh, NY (US); Michael P. Chudzik, Danbury, CT (US); Min Dai, Mahwah, NJ (US); Siddarth A. Krishnan, Peekskill, NY (US); Shreesh Narasimha, Beacon, NY (US); Shahab Siddiqui, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 13/300,146

(22) Filed: Nov. 18, 2011

(65) Prior Publication Data

US 2013/0126986 A1    May 23, 2013

(51) Int. Cl.
*H01L 21/336*    (2006.01)
(52) U.S. Cl.
USPC .................. 438/287; 257/E21.423
(58) Field of Classification Search
USPC .......... 438/775, 761, 285, 287, 770; 257/E21.423, E21.409
See application file for complete search history.

(56) References Cited

U.S. PATENT DOCUMENTS

| | | | |
|---|---|---|---|
| 3,431,636 A | 3/1969 | Granberry et al. | |
| 6,323,143 B1 * | 11/2001 | Yu | 438/791 |
| 6,737,302 B2 | 5/2004 | Arao | |
| 7,488,690 B2 | 2/2009 | Iyer et al. | |
| 7,517,818 B2 * | 4/2009 | Sugawara et al. | 438/792 |
| 7,749,879 B2 | 7/2010 | Ahn et al. | |

(Continued)

OTHER PUBLICATIONS

Xie et al., "Effective Surface Passivation by Novel SiH4-NH3 Treatmenat and BTI Characteristics on Interface-Engineered High-Mobility Hf02-Gated Ge pMOSFETs" IEEE Transactions on Electronic Devices, vol. 57 Jun. 6, 2010.

(Continued)

*Primary Examiner* — Daniel Luke
*Assistant Examiner* — Latanya N Crawford
(74) *Attorney, Agent, or Firm* — Scully, Scott, Murphy & Presser, P.C.; Joseph P. Abate (57) ABSTRACT

A semiconductor device including a germanium containing substrate including a gate structure on a channel region of the semiconductor substrate. The gate structure may include a silicon oxide layer that is in direct contact with an upper surface of the germanium containing substrate, at least one high-k gate dielectric layer in direct contact with the silicon oxide layer, and at least one gate conductor in direct contact with the high-k gate dielectric layer. The interface between the silicon oxide layer and the upper surface of the germanium containing substrate is substantially free of germanium oxide. A source region and a drain region may be present on opposing sides of the channel region.

26 Claims, 4 Drawing Sheets

(56) References Cited

U.S. PATENT DOCUMENTS

| | | |
|---|---|---|
| 2002/0102797 A1 | 8/2002 | Muller et al. |
| 2005/0070122 A1* | 3/2005 | Gousev et al. ............... 438/765 |
| 2005/0260347 A1* | 11/2005 | Narwankar et al. ........ 427/248.1 |
| 2006/0105533 A1* | 5/2006 | Chong et al. .................. 438/322 |
| 2006/0292872 A1* | 12/2006 | Haukka et al. ................ 438/680 |
| 2007/0099398 A1* | 5/2007 | Sugawara et al. ............. 438/478 |
| 2007/0111521 A1 | 5/2007 | Wilk |
| 2007/0173006 A1* | 7/2007 | Moniwa et al. ............... 438/197 |
| 2008/0017936 A1* | 1/2008 | Buchanan et al. ............ 257/411 |
| 2009/0242957 A1* | 10/2009 | Ma et al. ....................... 257/316 |
| 2009/0321809 A1 | 12/2009 | Ramaswamy et al. |
| 2010/0001353 A1* | 1/2010 | Mieno ........................... 257/411 |
| 2010/0044803 A1 | 2/2010 | Chen et al. |
| 2010/0075507 A1* | 3/2010 | Chang et al. .................. 438/763 |
| 2010/0151693 A1* | 6/2010 | Shimizu ........................ 438/761 |
| 2010/0230756 A1 | 9/2010 | Thean et al. |
| 2011/0012210 A1 | 1/2011 | Xu |
| 2011/0169141 A1* | 7/2011 | Shepard et al. ............... 257/640 |
| 2012/0319207 A1 | 12/2012 | Iijima |

OTHER PUBLICATIONS

Joshi et al. "Improved Ge Surface Passivation With Ultrathin SiOx Enabling High-Mobility Surface Channel pMOSFETs Featuring a HfSiO/WN Gate Stack" EEE Transactions on Electronic Devices, vol. 28 Apr. 4, 2007.

Lu et al. "Ge diffusion in Ge metal oxide semiconductor with chemical vapor deposition Hf02 dielectric" Applied Physics Letters, vol. 8, Jul. 2005.

McIntyre et al., "Interface Layers for High-k/Ge Gate Stacks: Are They Necessary?", ECS Transaction, The Electrochemical Society, vol. 3, Issue 7 Oct. 29-Nov. 3, 2006.

International Search Report PCT/US2012/052590 dated Oct. 19, 2012.

U.S. Office Action dated Dec. 20, 2013 issued in U.S. Appl. No. 14/077,918.

* cited by examiner

GERMANIUM OXIDE FREE ATOMIC LAYER DEPOSITION OF SILICON OXIDE AND HIGH-K GATE DIELECTRIC ON GERMANIUM CONTAINING CHANNEL FOR CMOS DEVICES

BACKGROUND

The present disclosure is related to semiconductor devices. More particularly, the present disclosure is related to semiconductor devices on germanium-containing substrates.

Various benefits can be realized by reducing the dimensions of semiconductor devices. One benefit is the ability to increase the number of individual devices that can be placed onto a semiconductor substrate without increasing its relative size. Also, increasing the number of individual devices leads to increased functionality. Yet another benefit is increased speed of the individual devices as well as their collective arrangements. The semiconductor industry has been realizing these size-reduction benefits using silicon substrates. But, in addition to scaling, i.e., size reduction, other materials are being investigated to increase semiconductor device performance. One promising material for use in a variety of semiconductor and optoelectronic devices is germanium (Ge). Germanium has very high carrier mobility and generally superior transport properties, relative to other materials. For example, relative to silicon (Si), germanium's electron mobility is two-fold larger, and its hole mobility four-fold larger.

SUMMARY

The present disclosure provides a method of forming a gate structure of a semiconductor device on a germanium containing semiconductor substrate. In one embodiment, the method includes depositing a silicon oxide layer on a germanium containing substrate with atomic layer deposition (ALD) at a deposition temperature ranging from 375° C. to 450° C., wherein the deposition temperature volatizes germanium oxide from the surface of the germanium containing substrate. A high-k gate dielectric layer may then be formed atop the silicon oxide layer. A gate structure is then formed on a channel portion of the germanium containing substrate, wherein the gate structure includes at least one gate conductor on an upper surface of a dielectric stack comprised of the high-k gate dielectric layer and the silicon oxide layer. Source and drain regions are then formed on opposing sides of the channel portion of the germanium containing substrate.

In another embodiment, a method of forming a gate structure of a semiconductor device including a high-k gate dielectric layer is provided that includes passivating a deposition surface of a germanium containing substrate with an ammonia containing bake. The ammonia containing bake forms a silicon nitride dielectric on the deposition surface of the germanium containing substrate. Following passivation of the deposition surface, a silicon oxide layer is deposited by atomic layer deposition on the silicon nitride layer of the deposition surface. A high-k gate dielectric layer may then be formed atop the silicon oxide layer. A gate structure is then formed on a channel portion of the germanium containing substrate, wherein the gate structure includes at least one gate conductor on an upper surface of a dielectric stack comprised of the high-k gate dielectric layer and the silicon oxide layer. Source and drain regions are then formed on opposing sides of the channel portion of the germanium containing substrate.

In yet another embodiment, the present disclosure provides a method of forming a gate structure for a semiconductor device that includes a high-k gate dielectric layer, in which the method includes passivating a deposition surface of a germanium containing substrate with a nitrogen containing anneal. The nitrogen anneal forms a silicon oxynitride dielectric on the deposition surface of the germanium containing substrate. Following passivation of the deposition surface, a silicon oxide layer is deposited by atomic layer deposition on the silicon oxynitride layer of the deposition surface. A high-k gate dielectric layer may then be formed atop the silicon oxide layer. A gate structure is then formed on a channel portion of the germanium containing substrate, wherein the gate structure includes at least one gate conductor on an upper surface of a dielectric stack comprised of the high-k gate dielectric layer and the silicon oxide layer. Source and drain regions are then formed on opposing sides of the channel portion of the germanium containing substrate.

In another embodiment, a method of forming gate structures on a semiconductor substrate is provided, in which the semiconductor substrate includes a silicon region and a germanium containing region. In one embodiment, the method includes providing a substrate including a silicon region and a germanium containing region. A first silicon oxide layer is deposited by chemical vapor deposition on an upper surface of the silicon region and the germanium containing region of the substrate. A second silicon oxide layer is deposited on the first silicon oxide layer by atomic layer deposition. A high-k gate dielectric layer may then be formed atop the second silicon oxide layer. A first gate structure is then formed on a first channel portion of the silicon containing region of the substrate and a second gate structure is formed on a second channel portion of the germanium containing region, wherein the first and second gate structures each include at least one gate conductor on an upper surface of a dielectric stack comprised of a portion of the high-k gate dielectric layer, a portion of the first silicon oxide layer, and a portion of the second silicon oxide layer. Source and drain regions may then be formed on opposing sides of the first and second channel portions.

In another aspect of the present disclosure, a semiconductor device is provided that includes a germanium containing substrate, and a gate structure on a channel region of the semiconductor substrate. The gate structure includes a silicon oxide layer that is in direct contact with an upper surface of the germanium containing substrate that contains the channel region, at least one high-k gate dielectric layer in direct contact with the silicon oxide layer, and at least one gate conductor in direct contact with the at least one high-k gate dielectric layer. The interface between the silicon oxide layer and the upper surface of the germanium containing substrate is substantially free of germanium oxide. Source and drain regions are present on opposing sides of the channel region.

BRIEF DESCRIPTION OF THE DRAWINGS

The following detailed description, given by way of example and not intended to limit the disclosure solely thereto, will best be appreciated in conjunction with the accompanying drawings, wherein like reference numerals denote like elements and parts, in which.

DETAILED DESCRIPTION

Detailed embodiments of the claimed structures and methods are disclosed herein; however, it is to be understood that the disclosed embodiments are merely illustrative of the claimed structures and methods that may be embodied in various forms. In addition, each of the examples given in connection with the various embodiments are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the methods and structures of the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The present disclosure relates to forming semiconductor devices. As used herein, the term "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. In one embodiment, the semiconductor device is a field effect transistor.

As used herein a "field effect transistor" is a transistor in which output current, i.e., source-drain current, is controlled by the voltage applied to a gate structure. A field effect transistor has three terminals, i.e., a gate structure, source region and drain region. As used herein, the term "source" is a doped region in the semiconductor device, in which majority carriers are flowing into the channel. As used herein, the term "channel" is the region underlying the gate structure and between the source and drain of a semiconductor device that becomes conductive when the semiconductor device is turned on. As used herein, the term "drain" means a doped region in semiconductor device located at the end of the channel, in which carriers are flowing out of the transistor through the drain. A "gate structure" means a structure used to control output current (i.e., flow of carriers in the channel) of a semiconducting device through electrical or magnetic fields. Although the present disclosure describes the details of forming a field effect transistors (FET), the present disclosure is not limited to only this type of semiconductor device, as other semiconductor devices have been contemplated and are within the scope of the present disclosure. For example, the methods disclosed herein are applicable to any semiconductor device including a gate structure, which includes memory devices and logic devices.

Silicon germanium and germanium substrates are suitable for p-type semiconductor devices in a complementary metal oxide semiconductor (CMOS) device arrangement. For semiconductor devices, silicon oxide and silicon oxynitride gate dielectrics are commonly used as gate dielectrics. Due to the germanium in the substrate, high temperature deposition processes, e.g., deposition processes employing a temperature ranging from 850° C. to 1300° C., are avoided, because the high temperature can cause germanium diffusion, and may change the stoichiometry of silicon germanium. To avoid high temperature processing, low temperature chemical vapor deposition, e.g., deposition processes employing a temperature ranging from 600° C. to 800° C., has been employed to deposit silicon oxide. It has been determined that layers of silicon oxide deposited on germanium containing substrates with low temperature chemical vapor deposition are not very uniformal, e.g., silicon oxide deposited by low temperature chemical vapor deposition may have a thickness with a 1 sigma non-uniformity ranging from 0.4 Å to 0.5 Å. This variation in thickness may result in a variation in the inversion layer thickness and may cause leakage variation.

Chemical vapor deposition (CVD), which differs from atomic layer deposition (ALD), is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. In chemical vapor deposition, the desired layer is deposited on the substrate from vaporized metal precursor compounds and any reaction gases used within a deposition chamber with no effort made to separate the reaction components.

In one embodiment, the present disclosure provides a method of forming a silicon oxide layer atop a germanium containing substrate using an atomic layer deposition (ALD) process that avoids the formation of geranium oxide (GeO) on the surface of the germanium containing substrate. In some embodiments, by depositing silicon oxide with atomic layer deposition without forming, or substantially reducing, germanium oxide (GeO), the methods disclosed herein overcome the variability in the thickness of the silicon oxide layers that are deposited on germanium containing substrates using low temperature chemical vapor deposition.

"Atomic layer deposition" (ALD) as used herein refers to a vapor deposition process in which numerous consecutive deposition cycles are conducted in a deposition chamber. Typically, during each cycle a metal precursor is chemisorbed to the substrate surface; excess precursor is purged out; a subsequent precursor and/or reaction gas is introduced to react with the chemisorbed layer; and excess reaction gas (if used) and by-products are removed. "Chemisorption" and "chemisorbed" as used herein refer to the chemical adsorption of vaporized reactive precursor compounds on the deposition surface. The adsorbed species are irreversibly bound to the deposition surface as a result of relatively strong binding forces characterized by high adsorption energies (>30 kcal/mol), comparable in strength to ordinary chemical bonds. The chemisorbed species are limited to the formation of a monolayer on the deposition surface.

In atomic layer deposition one or more appropriate reactive precursor compounds are alternately introduced (e.g., pulsed) into a deposition chamber and chemisorbed onto the deposition surface. Each sequential introduction of a reactive precursor compound is typically separated by an inert carrier gas purge. Each precursor compound co-reaction adds a new atomic layer to previously deposited layers to form a cumulative solid layer. The cycle is repeated, typically for several hundred times, to gradually form the desired layer thickness. It should be understood, however, that atomic layer deposition can use one precursor compound and one reaction gas. As compared to the one cycle chemical vapor deposition process, the longer duration multi-cycle atomic layer deposition process allows for improved control of layer thickness by self-limiting layer growth and minimizing detrimental gas phase reactions by separation of the reaction components.

Typically, atomic layer deposition is a self-limiting (the amount of film material deposited in each reaction cycle is constant), sequential surface chemistry that deposits conformal thin-films of materials onto deposition surfaces of varying compositions. Atomic layer deposition is similar in chemistry to chemical vapor deposition, except that the atomic layer deposition reaction breaks the chemical vapor deposition reaction into two half-reactions, keeping the precursor materials separate during the reaction.

In some embodiments, the silicon oxide layer deposited by atomic layer deposition in accordance with the methods disclosed herein have a thickness with a 1 sigma non-uniformity of less than 0.2 Å. Therefore, by providing a more uniformly deposited silicon oxide layer overlying a germanium containing substrate, the present disclosure in some embodiments provides an enhancement in inversion layer thickness uniformity and reduced leakage, when compared to silicon oxide layers deposited using chemical vapor deposition. Therefore, because the methods disclosed herein reduce variation in the thickness of the silicon oxide layer, in some embodiments the present disclosure reduces the variation in the inversion layer thickness and reduces leakage in semiconductor devices.

Figure 1:
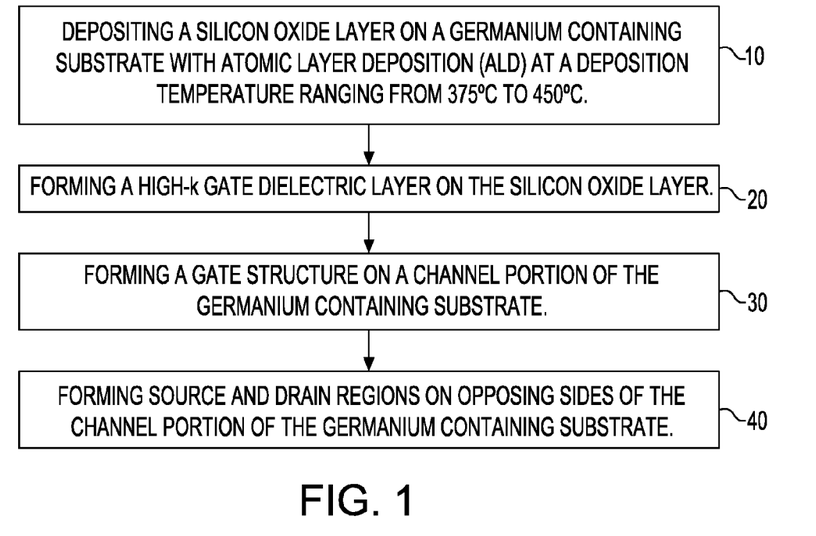
FIG. 1 is a flow chart depicting one embodiment of a method of forming a semiconductor device that includes forming a silicon oxide layer on a germanium containing substrate with a high temperature atomic layer deposition (ALD) method, in accordance with the present disclosure.

FIG. 1 is a flow chart depicting one embodiment of a method of forming a silicon oxide layer on a germanium containing substrate with a high temperature atomic layer deposition process. By "high temperature" it is meant that the temperature of the deposition process ranges from 375° C. to 450° C. It is noted that FIG. 1 only depicts the steps of one embodiment of a method of forming a semiconductor device, and that it is not intended that the present disclosure be limited to the steps that are included in FIG. 1.

Figure 2:
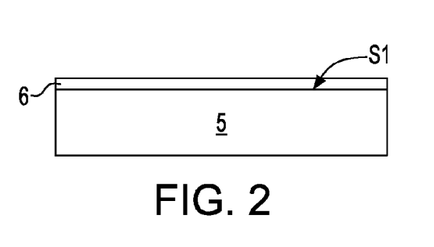
FIG. 2 is a side cross-sectional view depicting passivating an upper surface of a germanium containing substrate, in accordance with one embodiment of the present disclosure.

Prior to forming the silicon oxide layer, the method may begin with the step 10 of passivating, i.e., forming a passivation layer 6, on an upper surface S1 of the germanium containing substrate 5, as depicted in FIG. 2. In one embodiment, the germanium containing substrate 5 that is depicted in FIG. 2 may be a silicon germanium substrate having a germanium content that is greater than 25 at. %, and a silicon content that is less than 75 at. %. In another embodiment, the germanium containing substrate 5 may have a germanium content that is greater than 50 at. %, and a silicon content that is less than 50 at. %. In another embodiment, the germanium containing substrate 5 may be a substrate that is substantially 100% germanium. For example, the germanium containing substrate 5 may have a germanium content that is greater than 99 at. %. In another example, the germanium containing substrate 5 may have a germanium content that is 100 at. %. In one embodiment, the thickness of the germanium containing substrate 5 may range from 10 μm to 1 mm. In another embodiment, the thickness of the germanium containing substrate 5 may range from 150 μm to 700 μm. It is noted that the above thicknesses for the germanium containing substrate 5 have been provided for illustrative purposes only, and are not intended to limit the present disclosure.

The germanium containing substrate 5 may be doped to an n-type or p-type conductivity or may be an intrinsic semiconductor layer. As used herein, "p-type" refers to the addition of impurities to an intrinsic semiconductor that creates deficiencies of valence electrons (i.e. holes). As used herein, "n-type" refers to the addition of impurities that contributes free electrons to an intrinsic semiconductor. The dopant that provides the conductivity type of the germanium containing substrate 5 may be introduced by an in-situ doping process. The term "conductivity type" denotes a p-type or n-type dopant.

The passivation layer 6 illustrated in FIG. 2 can be formed by atomic layer deposition at a deposition temperature ranging from 375° C. to 450° C. In some embodiments that employ a high temperature atomic layer deposition process, prior to deposition of the silicon oxide layer, a passivation layer 6 composed of silicon germanium oxide (SiGeO) is formed on an upper surface S1 of germanium containing substrate, as depicted in FIG. 2. In this embodiment, the deposition temperature volatizes germanium oxide (GeO) from the surface of the germanium containing substrate 5. By "volatize" it is meant that the germanium oxide is converted from a solid to a vapor, i.e., gas, form and removed from the surface of the germanium containing substrate 5. In one example, the deposition temperature that volatizes the germanium oxide from the germanium containing substrate 5 ranges from 400° C. to 425° C.

In one embodiment, the passivation layer 6 that is formed by the high temperature ALD process is composed of silicon germanium oxide (SiGeO), in which the passivation layer 6 has a silicon content ranging from 30% to 40%, a germanium content ranging from 1% to 5% and an oxygen content ranging from 60% to 70%. In another embodiment, the passivation layer 6 is composed of silicon germanium oxide (SiGeO), in which the passivation layer 6 has a silicon content ranging from 30% to 35%, a germanium content ranging from 1% to 3% and an oxygen content ranging from 60% to 63%. The thickness of the passivation layer 6 composed of silicon germanium oxide may range from 0.1 nm to 0.5 nm. In one embodiment, the thickness of the passivation layer 6 ranges from 0.1 nm to 0.2 nm.

Figure 3:
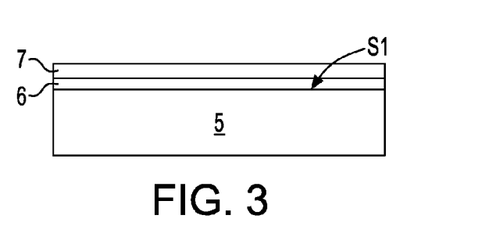
FIG. 3 is a side cross-sectional view depicting forming a silicon oxide layer on the passivated surface of the germanium containing substrate, in accordance with one embodiment of the present disclosure.

Referring to FIG. 3, the silicon oxide layer 7 is formed atop the passivation layer 6 that is present on the surface S1 of the germanium containing substrate 5. The silicon oxide layer 7 is formed by the same high temperature ALD process that forms the passivation layer 6. ALD of the silicon oxide layer 7 may include a deposition precursor selected from the group consisting of vinyl-trimethoxysilane (VTMOS), trivinyl-methoxysilane (TVMOS), tetrakis(dimethylamino)silane (TKDMAS), tris(dimethylamino)silane (TDMAS), (N,N Dimethylaminotrimethylsilane) DMATMS, BTBAS (Bis (TertiaryButylamino Silane) and combinations thereof. Other precursors could also be employed.

The silicon oxide layer 7 that is deposited by atomic layer deposition may have a silicon content ranging from 20% to 40% and an oxygen content ranging from 50% to 70%. In another embodiment, the silicon content ranges from 25% to 30% and the oxygen content ranges from 70% to 75%. The thickness of the silicon oxide layer 7 may range from 0.1 nm to 50 nm. In another embodiment, the thickness of the silicon oxide layer 7 may range from 0.1 nm to 0.4 nm. In one embodiment, the thickness of the silicon oxide layer 7 is uniform across the entire width of the germanium containing substrate 5.

In one embodiment, the silicon oxide layer 7 is in direct contact with the passivation layer 6 that is composed of silicon germanium oxide, wherein the silicon passivation layer 6 is in direct contact with the upper surface S1 of the germanium containing substrate 5. In another embodiment, the interface between the silicon oxide layer 7 and the underlying upper surface S1 of the germanium containing substrate 5 is free of germanium oxide. By being free of germanium oxide, it is meant that the germanium oxide is removed in its entirety. By substantially eliminating germanium oxide from the surface S1 of the germanium containing substrate 5, the silicon oxide layer 7 that is formed on the passivation layer 6 is substantially uniform in comparison to silicon oxide layers formed atop a germanium containing substrate 5 that includes germanium oxide present thereon. More specifically, in one embodiment, the thickness of the silicon oxide layer 7 that is formed over a substantially germanium oxide free surface of a germanium containing substrate 5 has a 1 sigma non-uniformity of less than 0.2 Å.

Figure 4:
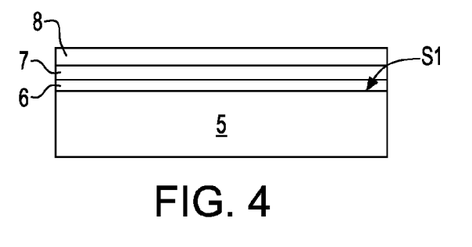
FIG. 4 is a side cross-sectional view depicting forming a high-k gate dielectric layer over the silicon oxide layer, in accordance with one embodiment of the present disclosure.

Referring to step 20 of FIG. 1 and the structure depicted in FIG. 4, a high-k gate dielectric layer 8 is formed on the silicon oxide layer 7. The term "high-k" denotes a dielectric constant that is greater than the dielectric constant of silicon oxide. For example, a high-k gate dielectric layer 8 typically has a dielectric constant of 4.0 or greater at room temperature (e.g., 20° C. to 25° C.) and atmospheric pressure (e.g., 1 atm). In another embodiment, the high-k gate dielectric layer 8 has a dielectric constant of 7.0 or greater at room temperature and atmospheric pressure. In yet another embodiment, the high-k gate dielectric layer 8 has a dielectric constant of 10.0 or greater at room temperature and atmospheric pressure.

In one embodiment, the high-k gate dielectric layer 8 is a hafnium (Hf) based dielectric. In some embodiments, the hafnium (Hf) based dielectric that provides the high-k gate dielectric layer 8 may be one of hafnium oxide ($HfO_2$), hafnium silicate ($HfSiO_x$) Hf silicon oxynitride (HfSiON) or multilayers thereof. In some embodiments, the Hf based dielectric that provides the high-k gate dielectric layer 8 comprises a mixture of $HfO_2$ and $ZrO_2$. It is noted that the above compositions for the high-k gate dielectric layer 8 are provided for illustrative purposes only and are not intended to limit the present disclosure. The physical thickness of the high-k gate dielectric layer 8 may range from 0.5 nm to 10 nm. In another embodiment, the physical thickness of the high-k gate dielectric layer 8 can range from 0.5 nm to 3 nm.

In one embodiment, the high-k gate dielectric layer 8 may be deposited using chemical vapor deposition or atomic layer deposition processes. In the embodiments, in which the high-k gate dielectric layer 8 is deposited using chemical vapor deposition, the chemical vapor deposition process may be selected from the group consisting of Atmospheric Pressure CVD (APCVD), Low Pressure CVD (LPCVD) and Plasma Enhanced CVD (EPCVD), Metal-Organic CVD (MOCVD) and combinations thereof. In one embodiment, in which the high-k gate dielectric layer 8 is composed of hafnium oxide (HfO2), the hafnium oxide may be formed by MOCVD with a flow rate ranging from 70 mg/m to 90 mg/m of hafnium-tetrabutoxide (a Hf-precursor) and a flow rate of $O_2$ of ranging from 250 sccm to 350 sccm. The deposition of hafnium oxide occurs using a chamber pressure between 0.3 Torr and 0.5 Torr and a deposition temperature of between 400° C. and 500° C. In another embodiment, in which the high-k gate dielectric layer 8 is composed of hafnium silicate, the hafnium silicate is formed by MOCVD using a flow rate of the precursor Hf-tetrabutoxide of between 70 mg/m and 90 mg/m, a flow rate of $O_2$ between 25 sccm and 100 sccm, and a flow rate of $SiH_4$ of between 20 sccm and 60 sccm; a chamber pressure between 0.3 Torr and 0.5 Torr, and a deposition temperature between 400° and 500° C.

Figure 5:
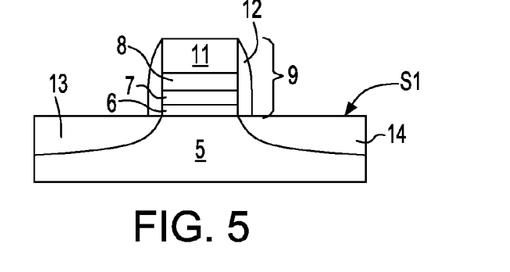
FIG. 5 is a side cross-sectional view depicting forming a gate structure including a portion of the high-k gate dielectric and the silicon oxide layer, and forming source and drain regions in the germanium containing substrate on opposing sides of the gate structure, in accordance with one embodiment of the present disclosure.

Referring to FIGS. 1 and 5, the method may continue in step 30 with forming a gate structure 9 on a channel portion of the germanium containing substrate 5. The term "gate structure" means a structure used to control output current (i.e., flow of carriers in the channel) of a semiconducting device, such as a field effect transistor (FET), and includes at least one gate conductor and at least one gate dielectric. The "channel" is the portion of the germanium containing substrate 5 underlying the gate structure 9 that is between the subsequently formed source and drain regions. The gate structure 9 may include at least one gate conductor 11 on an upper surface of a dielectric stack comprised of the high-k gate dielectric layer 8, the silicon oxide layer 7 and the passivation layer 6.

The gate conductor 11 may comprise any conductive material including, but not limited to, polysilicon, a conductive elemental metal such as W, Pt, Ru, Ir, Rh, Mo, Ni, and Re, alloys that include at least one of the aforementioned conductive elemental metals, silicides that include at least one of the above-mentioned conductive elemental metals, and combinations thereof. The gate conductor 11 may be formed by a deposition process, such as chemical vapor deposition, physical vapor deposition (PVD) or atomic layer deposition.

In the embodiments, in which the gate conductor 11 is deposited using chemical vapor deposition, the chemical vapor deposition process may be selected from the group consisting of Atmospheric Pressure CVD (APCVD), Low Pressure CVD (LPCVD) and Plasma Enhanced CVD (EPCVD), Metal-Organic CVD (MOCVD) and combinations thereof. In some embodiments, in which the gate conductor 11 is composed of polysilicon, the silicon precursor can be either silane ($SiH_4$) or dichlorosilane ($SiCl_2H_2$). In the embodiments, in which the gate conductor 11 is composed of polysilicon, the polysilicon may be in-situ with an n-type, or p-type dopant. In in-situ doping, dopant precursors can be also added to the deposition ambient. In some embodiments, $PH_3$, $AsH_3$, $B_2H_6$ gasses can be used as a source of P, As, or B dopants, respectively.

The material layers that provide the passivation layer 6, the silicon oxide layer 7, the high-k gate dielectric layer 8 and the gate conductor 11 may then be patterned and etched to provide the gate structure 9 using photolithography and etch processes. Specifically, a pattern is produced by applying a photoresist layer to the surface to be etched, exposing the photoresist layer to a pattern of radiation, and then developing the pattern into the photoresist utilizing a resist developer. Once the patterning of the photoresist layer is completed, the sections covered by the patterned photoresist are protected while the exposed regions are removed using a selective etching process that removes the unprotected regions. The etch process may be an anisotropic etch, such as reactive ion etch (RIE).

Referring to FIGS. 1 and 5, the method may continue in step 40 with forming source regions 13 and drain regions 14 on opposing sides of the channel portion of the germanium containing substrate 5. The source regions 13 and the drain regions 14 may be doped to an n-type conductivity or a p-type conductivity. As used herein, the term "conductivity type" denotes a dopant region being p-type or n-type. As used herein, "p-type" refers to the addition of impurities to an intrinsic semiconductor that creates deficiencies of valence electrons. In a silicon-containing substrate, examples of n-type dopants, i.e., impurities, include but are not limited to, boron, aluminum, gallium and indium. As used herein, "n-type" refers to the addition of impurities that contribute free electrons to an intrinsic semiconductor. In a silicon containing substrate examples of n-type dopants, i.e., impurities, include but are not limited to antimony, arsenic and phosphorous. The dopant that dictates the conductivity type of the source and drain regions 13, 14 may be introduced using ion implantation. Although the source and drain regions 13, 14 are depicted as being formed within the germanium containing substrate 5, embodiments have been contemplated in which the source and drain regions 13, 14 are raised source and drain regions provided by epitaxially grown and in situ doped semiconductor material that is present on an upper surface S1 of the germanium containing substrate 5. In some embodiments, prior to forming the source and drain regions 13, 14, a set of spacers 12 can be formed in direct contact with the sidewalls of the gate structure 9. The spacers 12 may be employed to dictate the positioning of the dopants being implanted into the germanium containing substrate 5. In some embodiments, the spacers 12 have a width ranging from 2.0 nm to 15.0 nm.

Figure 6:
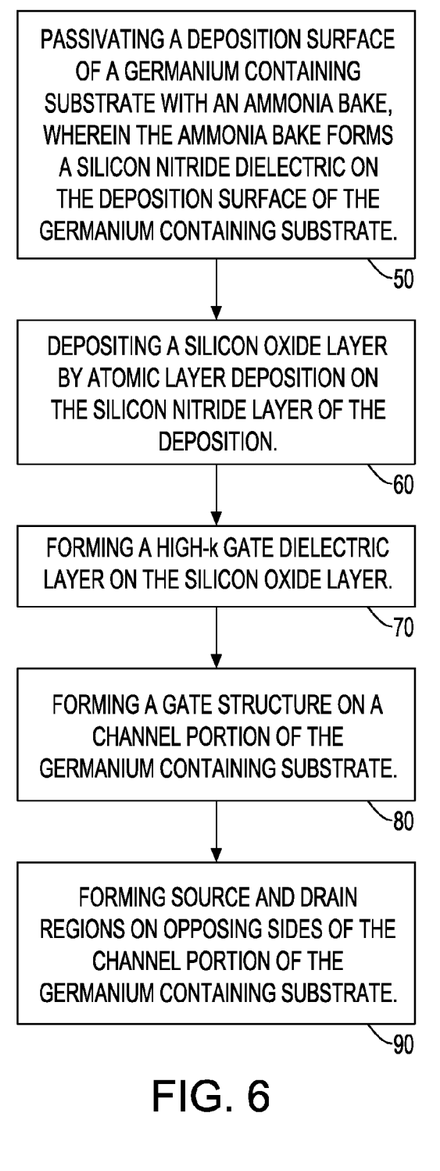
FIG. 6 is a flow chart depicting one embodiment of a method of forming a semiconductor device that includes forming a silicon oxide layer on a germanium containing substrate following an ammonia containing prebake, in accordance with one embodiment of the present disclosure.

FIG. 6 is a flow chart depicting another embodiment of a method of forming a semiconductor device that includes forming a silicon oxide layer on a germanium containing substrate following an ammonia containing prebake. It is noted that FIG. 6 only depicts the steps of one embodiment of a method of forming a semiconductor device with a process sequence including an ammonia containing prebake, and that it is not intended that the present disclosure be limited to only the steps that are included in FIG. 6. In one embodiment, the method may begin at step 50 with passivating, i.e., forming a passivation layer 6, on the upper surface S1 of the germanium-containing substrate 5 with the ammonia containing prebake. In one embodiment, the ammonia bake forms a passivation layer 6 composed of a silicon nitride dielectric on the deposition surface S1 of the germanium containing substrate 5, as depicted in FIG. 2.

The structures depicted in FIGS. 2-5 are suitable for describing the embodiments of the disclosure consistent with the method described in the flow chart of FIG. 6. More specifically, the germanium containing substrate 5 of the embodiment that is described with reference to the flow chart depicted in FIG. 6 is similar to the germanium containing substrate 5 that is described above with reference to the flow chart depicted in FIG. 1. Therefore, the description of the germanium containing substrate 5 that is described above with reference to FIG. 1 is suitable for the germanium containing substrate 5 that is described with reference to FIG. 6.

The passivation layer 6 formed by the method consistent with the flow chart in FIG. 6 may be composed of silicon nitride, as formed by the ammonia containing prebake, and is therefore differentiated from the passivation layer 6 produced by the flow chart that is depicted in FIG. 1. The passivation layer 6 produced by the method of the flow chart in FIG. 1 is composed of silicon germanium oxide as formed by the above-described high temperature atomic layer deposition process.

In one embodiment, the ammonia containing prebake is composed of ammonia ($NH_3$) gas with substantially no oxygen ($O_2$). In one embodiment, the atmosphere of the ammonia containing prebake is comprised of entirely ammonia gas, i.e., the ammonia containing prebake is comprised of 100% ammonia gas. In other embodiments, the ammonia containing prebake is comprised of ammonia gas in combination with an inert carrier gas, such as hydrogen ($H_2$). The temperature of the ammonia containing prebake may range from 350° C. to 850° C. In another embodiment, the temperature of the ammonia containing prebake may range from 400° C. to 800° C. In some embodiments, the ammonia gas of the ammonia containing prebake may be introduced to the deposition chamber at a flow rate ranging from 5 sccm to 50 sccm. Typical $NH_3$ flow is within the range of 5 sccm to 20 sccm, with chamber pressure in the range of 2 Torr to 10 Torr.

The passivation layer 6 that is formed by the ammonia containing prebake has a silicon nitride composition. In one embodiment, the silicon nitride of the passivation layer 6 has a silicon content ranging from 85% to 90%, and a nitrogen content ranging from 10% to 15%. In another embodiment, the silicon nitride of the passivation layer 6 has a silicon content ranging from 90% to 95%, and a nitrogen content ranging from 5% to 10%. In another embodiment, silicon nitride of the passivation layer 6 has a silicon content ranging from 90% to 97%, and a nitrogen content ranging from 3% to 10%. In one embodiment, the passivation layer 6 of silicon nitride formed in accordance with the process flow depicted in FIG. 6 may have a thickness ranging from 0.5 nm to 1 nm.

Referring to FIGS. 3 and 6, in a following step 60, a silicon oxide layer 7 is deposited by atomic layer deposition on the passivation layer 6 of silicon nitride that is present on the surface S1 of the germanium containing substrate 5. In one embodiment, the silicon oxide layer 7 is in direct contact with the passivation layer 6 that is composed of silicon nitride, wherein the passivation layer 6 of silicon nitride is in direct contact with the upper surface S1 of the germanium containing substrate 5. Similar to the embodiments described with reference to the high-temperature atomic layer deposition process depicted in FIG. 1, the process flow depicted in FIG. 6 may form the silicon oxide layer 7 directly on the passivation layer 6, in which the interface between the silicon oxide layer 7 and the upper surface S1 of the germanium containing substrate 5 is free of germanium oxide. By substantially eliminating germanium oxide from the surface S1 of the germanium containing substrate 5, the silicon oxide layer 7 is substantially uniform in thickness in comparison to silicon oxide layers formed atop a germanium containing substrate 5 that includes germanium oxide present thereon. More specifically, in one embodiment, the thickness of the silicon oxide layer 7 that is formed over a substantially germanium oxide free surface of the germanium containing substrate 5 has a 1 sigma non-uniformity of less than 0.2 Å.

Figure 7:
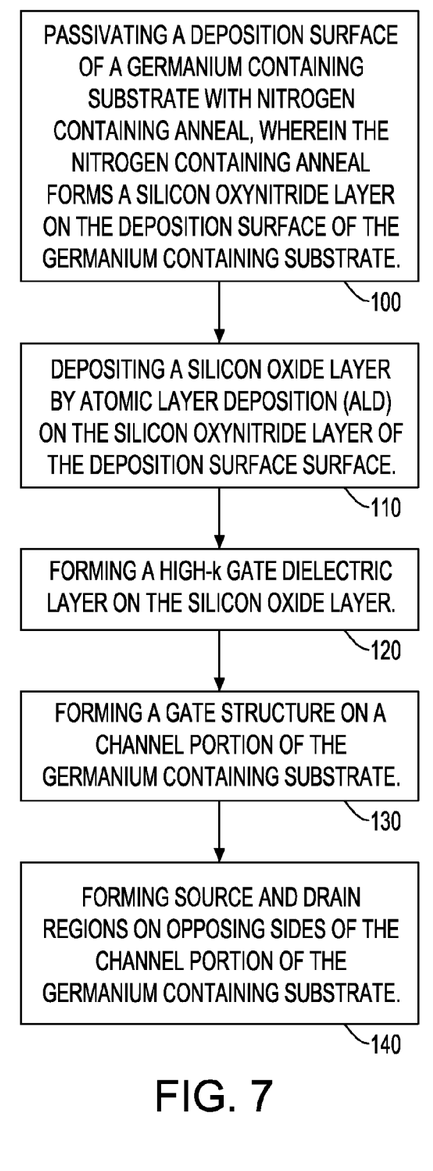
FIG. 7 is a flow chart depicting one embodiment of a method of forming a semiconductor device that includes forming a silicon oxide gate dielectric layer on a germanium containing substrate following a nitrogen containing anneal, in accordance with one embodiment of the present disclosure.

Referring to FIG. 6, similar to the embodiments described above with reference to FIG. 1, atomic layer deposition of the silicon oxide layer 7 may include a deposition precursor selected from the group consisting of vinyl-trimethoxysilane (VTMOS), trivinylmethoxysilane (TVMOS), tetrakis(dimethylamino)silane (TKDMAS), tris(dimethylamino)silane (TDMAS), (N,N Dimethylaminotrimethylsilane) DMATMS, BTBAS (Bis(TertiaryButylamino Silane) and combinations thereof. Other precursors may also be employed. The deposition precursor may be flow across the germanium containing substrate 5 at a flow rate ranging from 0.1 sccm to 1 sccm. In another embodiment, the deposition precursor may be flown across the germanium containing substrate 5 with a flow rate ranging from 0.3 sccm to 0.5 sccm.

In the embodiments of the present disclosure employing the ammonia prebake to passivate the surface of the germanium containing substrate 5, the temperature of the atomic layer deposition process for forming the silicon oxide layer 7 may range from room temperature (e.g., 20° C. to 25° C.) to 600° C. In another embodiment, the temperature of the atomic layer deposition process employed in step 60 of the method disclosed in FIG. 6 may range from 200° C. to 400° C. In the embodiments, in which the ammonia containing prebake passivated the upper surface S1 of the germanium containing substrate 5, e.g., forms a passivation layer 6 of silicon nitride of the germanium containing substrate 5, the deposition temperature of the atomic layer deposition process for forming the silicon oxide layer 7 may be less than the high temperature atomic layer deposition process for forming the silicon oxide layer 7 that is described above with reference to FIG. 1.

The silicon oxide layer 7 deposited by atomic layer deposition may have a silicon content ranging from 30% to 40% and an oxygen content ranging from 60% to 70%. The thickness of the silicon oxide layer 7 may range from 1 nm to 10 nm. In another embodiment, the thickness of the silicon oxide layer 7 may range from 1.5 nm to 3.5 nm. In one embodiment, the thickness of the silicon oxide layer 7 is uniform across the entire width of the germanium containing substrate 5.

In step 70 of the process flow depicted in FIG. 6, a high-k gate dielectric layer 8 is formed on the silicon oxide layer 7, as depicted in FIG. 4. The high-k gate dielectric layer 8 formed in the process flow depicted in FIG. 6 is similar to the high-k gate dielectric layer 8 that is described above for the process flow that is depicted in FIG. 6. Therefore, the above description of the high-k gate dielectric layer 8 with reference to FIGS. 1 and 4 is suitable for the high-k gate dielectric layer 8 that is referenced in the process flow depicted in FIG. 6.

In step 80 of the process flow depicted in FIG. 6, a gate structure 9 is formed on a channel portion of the germanium containing substrate 5, wherein the gate structure 9 includes at least one gate conductor 11 on an upper surface of a dielectric stack comprised of the high-k gate dielectric layer 8, the silicon oxide layer 7 and the passivation layer 6 composed of silicon nitride, as depicted in FIG. 5. The at least one gate conductor 11 and the gate structure 9 formed in the process flow depicted in FIG. 6 is similar to the at least one gate conductor 11 and the gate structure 9 that are described above for the process flow that is depicted in FIG. 1. Therefore, the above description of the at least one gate conductor 11 and the gate structure 9 with reference to FIGS. 1 and 5 are suitable for the at least one gate conductor 11 and the gate structure 9 that are referenced in the process flow depicted in FIG. 6.

In step 90 of the process flow depicted in FIG. 6, a source region 13 and a drain region 14 are formed on opposing sides of the channel portion of the germanium containing substrate 5, as depicted in FIG. 5. The source region 13 and the drain region 14 formed in the process flow depicted in FIG. 6 is similar to the source region 13 and drain region 14 that are described above for the process flow that is depicted in FIG. 1. Therefore, the above description of the source region 13 and drain region 14 with reference to FIGS. 1 and 5 is suitable for the source region 13 and drain region 14 that are referenced in the process flow depicted in FIG. 6.

FIG. 7 is a flow chart depicting one embodiment of a method of forming a semiconductor device that includes forming a silicon oxide layer on a germanium containing substrate following a nitrogen containing anneal. It is noted that FIG. 7 only depicts the steps of one embodiment of a method of forming a semiconductor device that include a nitrogen containing anneal, and that it is not intended that the present disclosure be limited to only the steps that are included in FIG. 7. In one embodiment, the method may begin at step 100 with passivating, i.e., forming a passivation layer 6, on the upper surface S1 of the germanium-containing substrate 5 with the nitrogen containing anneal. In one embodiment, the nitrogen containing anneal forms a passivation layer 6 composed of a silicon oxynitride dielectric on the deposition surface S1 of the germanium containing substrate 5, as depicted in FIG. 2. The structures depicted in FIGS. 2-5 are suitable for describing the embodiments of the disclosure consistent with the method described in the flow chart of FIG. 7. More specifically, the germanium containing substrate 5 of the embodiments that is described with reference to the flow chart depicted in FIG. 7 is similar to the germanium containing substrate 5 that is described above with reference to the flow chart depicted in FIG. 1. Therefore, the description of the germanium containing substrate 5 that is described above with reference to FIG. 1 is suitable for the germanium containing substrate 5 that is described with reference to FIG. 7. The passivation layer 6 formed by the methods consistent with the flow chart in FIG. 7 including the nitrogen containing anneal may be composed of silicon nitride, and is therefore differentiated from the passivation layer 6 produced by the methods described above with reference to the flow charts depicted in FIGS. 1 and 6.

In one embodiment, the nitrogen containing anneal is composed nitrous oxide ($N_2O$) gas. In one embodiment, the atmosphere of the nitrogen containing anneal is comprised of entirely of nitrous oxide gas, i.e., the nitrogen containing anneal is comprised of 100% nitrous oxide. In other embodiments, the nitrogen containing anneal is comprised of nitrous oxide gas in combination with an inert carrier gas, such as hydrogen ($H_2$) and nitrogen ($N_2$). The temperature of the nitrogen containing anneal may range from 350° C. to 850° C. In another embodiment, the temperature of the nitrogen containing anneal may range from 400° C. to 800° C. In some embodiments, the nitrous oxide gas of the nitrogen containing anneal may be introduced to the deposition chamber at a flow rate ranging from 10 sccm to 10000 sccm.

In one embodiment, the passivation layer 6 that is formed by the nitrogen containing anneal has a silicon oxynitride composition. In one embodiment, the silicon oxynitride of the passivation layer 6 has a silicon content ranging from 20% to 30%, an oxygen content ranging from 65% to 75%, and a nitrogen content ranging from 5% to 10%. In another embodiment, silicon oxynitride of the passivation layer 6 has a silicon content ranging from 30% to 40%, an oxygen content ranging from 5% to 10%, and a nitrogen content ranging from 5% to 10%. In yet another embodiment, silicon oxynitride of the passivation layer 6 has a silicon content ranging from 20% to 30%, an oxygen content ranging from 40% to 60%, and a nitrogen content ranging from 2% to 3%. The passivation layer 6 of silicon oxynitride formed in accordance with the process flow depicted in FIG. 7 may have a thickness ranging from 0.5 nm to 1 nm. In another embodiment, the passivation layer 6 of silicon oxynitride has a thickness that ranges from 0.4 nm to 0.7 nm.

Referring to FIGS. 3 and 7, in a following step 110, a silicon oxide layer 7 is deposited by atomic layer deposition on the passivation layer 6 of silicon oxynitride that is present on the surface S1 of the germanium containing substrate 5. Similar to the embodiments described with reference to the high-temperature atomic layer deposition process depicted in FIG. 1, and the atomic layer deposition process including the ammonia containing prebake depicted in FIG. 6, the process flow depicted in FIG. 7 may form the silicon oxide layer 7 directly on the passivation layer 6, in which the interface between the silicon oxide layer 7 and the upper surface S1 of the germanium containing substrate 5 is free of germanium oxide. In one embodiment, the silicon oxide layer 7 is in direct contact with the passivation layer 6 that is composed of silicon oxynitride, wherein the passivation layer 6 of silicon oxynitride is in direct contact with the upper surface S1 of the germanium containing substrate 5. By substantially eliminating germanium oxide from the surface S1 of the germanium containing substrate 5 with the nitrogen containing anneal, the atomic layer deposition formed silicon oxide layer 7 is substantially uniform in thickness in comparison to silicon oxide layers formed atop a germanium containing substrate 5 that includes germanium oxide present thereon. In one embodiment, the thickness of the silicon oxide layer 7 that is formed by an atomic layer deposition process employing a nitrogen containing anneal over a substantially germanium oxide (GeO) free surface of a germanium containing substrate 5 has a 1 sigma non-uniformity of less than 0.2 Å.

Referring to FIG. 7, similar to the embodiments described above with reference to FIG. 1, atomic layer deposition of the silicon oxide layer 7 may include a deposition precursor selected from the group consisting of vinyl-trimethoxysilane (VTMOS), trivinylmethoxysilane (TVMOS), tetrakis(dimethylamino)silane (TKDMAS), tris(dimethylamino)silane (TDMAS), (N,N Dimethylaminotrimethylsilane) DMATMS, BTBAS (Bis(TertiaryButylamino Silane) and combinations thereof. The deposition precursor may be flow across the germanium containing substrate 5 at a flow rate ranging from 0.3 sccm to 1 sccm. In another embodiment, the deposition precursor may be flown across the germanium containing substrate 5 with a flow rate ranging from 0.3 sccm to 0.5 sccm.

In the embodiments of the present disclosure employing the nitrogen containing anneal to passivate the surface of the germanium containing substrate 5, the temperature of the atomic layer deposition process for forming the silicon oxide layer 7 may range from room temperature (e.g., 20° C. to 25° C.) to 600° C. In another embodiment, the temperature of the atomic layer deposition process employed in step 110 of the method disclosed in FIG. 7 may range from 200° C. to 400° C. In the embodiments, in which the nitrogen containing anneal passivates the upper surface S1 of the germanium containing substrate 5, e.g., forms a passivation layer 6 of silicon oxynitride on the germanium containing substrate 5, the deposition temperature of the atomic layer deposition process for forming the silicon oxide layer 7 may be less than the high temperature atomic layer deposition process for forming the silicon oxide layer 7 that is described above with reference to FIG. 1.

The silicon oxide layer 7 deposited by atomic layer deposition in accordance with FIG. 7 may have a silicon content ranging from 30% to 40% and an oxygen content ranging from 60% to 70%. In one embodiment, the thickness of the silicon oxide layer 7 may range from 0.1 nm to 10 nm. In one embodiment, the thickness of the silicon oxide layer 7 is uniform across the entire width of the germanium containing substrate 5.

In step 120 of the process flow depicted in FIG. 7, a high-k gate dielectric layer 8 is formed on the silicon oxide layer 7, as depicted in FIG. 4. The high-k gate dielectric layer 8 formed in the process flow depicted in FIG. 7 is similar to the high-k gate dielectric layer 8 that is described above for the process flow that is depicted in FIG. 1. In step 130 of the process flow depicted in FIG. 7, a gate structure 9 is formed on a channel portion of the germanium containing substrate 5, wherein the gate structure 9 includes at least one gate conductor 11 on an upper surface of a dielectric stack comprised of the high-k gate dielectric layer 8, the silicon oxide layer 7 and the passivation layer 6 composed of silicon nitride, as depicted in FIG. 5. The at least one gate conductor 11 and the gate structure 9 formed in the process flow depicted in FIG. 7 is similar to the at least one gate conductor 11 and the gate structure 9 that are described above for the process flow that is depicted in FIG. 1. In step 140 of the process flow depicted in FIG. 7, source regions 13 and drains region 14 are formed on opposing sides of the channel portion of the germanium containing substrate 5, as depicted in FIG. 5. The source regions 13 and drains region 14 formed in the process flow depicted in FIG. 7 are similar to the source region 13 and drain region 14 that are described above for the process flow that is depicted in FIG. 1.

Figure 8:
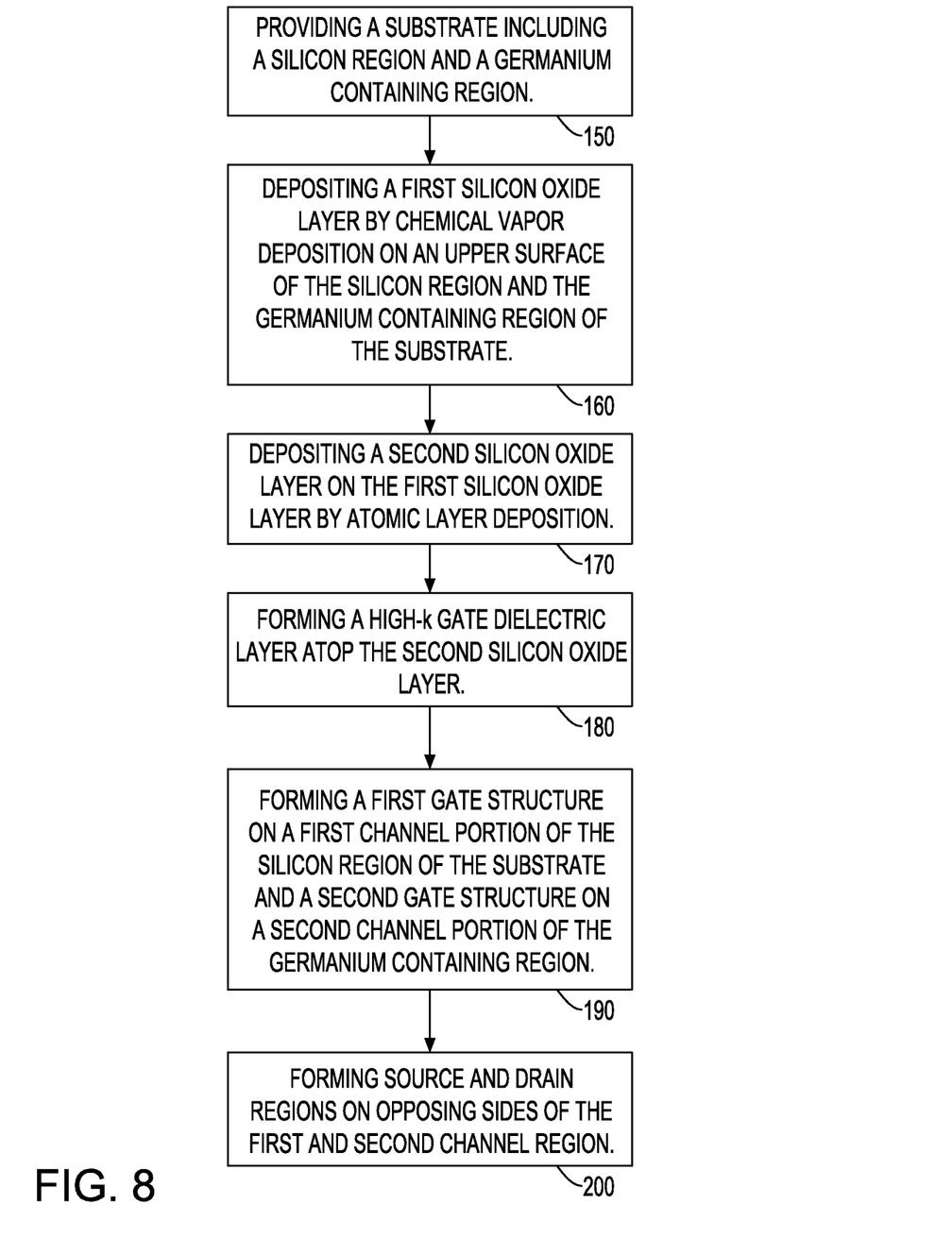
FIG. 8 is a flow chart depicting a method of forming a semiconductor device with gate structures including high-k gate dielectric layers on a substrate having a silicon region and a germanium containing region, in accordance with one embodiment of the present disclosure.

FIG. 8 is a flow chart depicting one embodiment of a method of forming a semiconductor device including forming gate structures including high-k gate dielectric layers on a substrate including a silicon region and a germanium containing region. It has been determined that atomic layer deposition formed silicon oxide has a different growth rate on silicon than on germanium containing materials. Therefore, blanket deposition by atomic layer deposition of silicon oxide on a substrate including both a silicon region and a germanium containing region results in a thickness variation of the deposited silicon oxide between the portion of the silicon oxide layer that is deposited on the silicon region of the substrate and the portion of the silicon oxide layer that is deposited on the germanium containing region of the substrate. In one embodiment, to overcome the thickness variation that results from the different compositions of the silicon region and the germanium containing region of the substrate, a silicon oxide layer is first blanket deposited over both the silicon region and the germanium containing region of the substrate by chemical vapor deposition. Thereafter, in some embodiments, a uniform thickness silicon oxide layer may be deposited by atomic layer deposition on the silicon oxide layer that was deposited by chemical vapor deposition on both the silicon region and the germanium containing region of the substrate.

Figure 9:
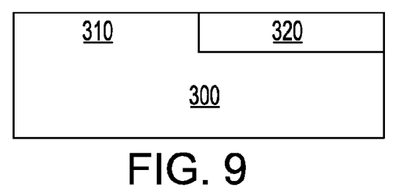
FIG. 9 is a side cross-sectional view depicting providing a substrate including a silicon region and a germanium containing region, in accordance with one embodiment of the present disclosure.

In one embodiment, the method may begin with the step 150 of providing a substrate 300 including a silicon region 310 and a germanium containing region 320, as depicted in FIG. 9. The substrate 300 may be a bulk semiconductor substrate composed of silicon. For example, the bulk semiconductor substrate of silicon may be composed of greater than 99% silicon, e.g., 100% silicon. In other embodiments, the substrate 300 may be a semiconductor on insulator (SOI) substrate (not shown) including a silicon on insulator (SOI) layer overlying a buried dielectric layer, in which the buried dielectric layer is over a base semiconductor layer.

In one embodiment, the germanium containing region 320 may be formed in the bulk semiconductor substrate using deposition, photolithography, etch and epitaxial growth processes. More specifically, a block mask (not shown) may be formed over the portion of the initial substrate 300 that provides the silicon region 310 of the semiconductor substrate. The block mask may be comprised of a patterned photoresist layer. Specifically, a pattern photoresist layer is produced by applying a photoresist layer to the surface to be etched, exposing the photoresist to a pattern of radiation, and then developing the pattern into the photoresist utilizing a resist developer. Once the patterning of the photoresist is completed, the sections covered by the patterned photoresist (also referred to as block mask) are protected while the exposed regions are removed using a selective etching process that removes the unprotected regions. In one embodiment, the exposed portion of the substrate 300 is etched with an anisotropic etch, such as reactive ion etch (RIE).

Following recessing of the upper surface of the substrate 300, a germanium containing semiconductor layer is then epitaxially formed on the etched surface of the substrate 300, wherein the germanium containing semiconductor layer provides the germanium containing region 320 of the substrate 300. The terms "epitaxial growth and/or deposition" and "epitaxially formed" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gasses are controlled and the system parameters are set so that the depositing atoms arrive at the deposition surface of the semiconductor substrate with sufficient energy to move around on the surface and orient themselves to the crystal arrangement of the atoms of the deposition surface. Thus, an epitaxial film deposited on a {100} crystal surface will take on a {100} orientation. If, on the other hand, the wafer surface has an amorphous surface layer, possibly the result of implanting, the depositing atoms have no surface to align to, resulting in the formation of polysilicon instead of single crystal silicon. The temperature for epitaxial silicon deposition typically ranges from 550° C. to 900° C. Although higher temperature typically results in faster deposition, the faster deposition may result in crystal defects and film cracking.

A number of different sources may be used for the deposition of epitaxial germanium. In some embodiments, the germanium containing gas sources for epitaxial growth of germanium include germane ($GeH_4$), digermane ($Ge_2H_6$), halogermane, dichlorogermane, trichlorogermane, tetrachlorogermane and combinations thereof.

When the germanium containing region 320 further includes silicon, the silicon may be introduced to the epitaxially grown material by a silicon containing gas sources selected from the group consisting of silane ($SiH_4$), disilane ($Si_2H_6$), trisilane ($Si_3H_8$), tetrasilane ($Si_4H_{10}$), hexachlorodisilane ($Si_2Cl_6$), tetrachlorosilane ($SiCl_4$), dichlorosilane ($Cl_2SiH_2$), trichlorosilane ($Cl_3SiH$), methylsilane (($CH_3$)$SiH_3$), dimethylsilane (($CH_3$)$_2SiH_2$), ethylsilane (($CH_3CH_2$)$SiH_3$), methyldisilane (($CH_3$)$Si_2H_5$), dimethyldisilane (($CH_3$)$_2Si_2H_4$), hexamethyldisilane (($CH_3$)$_6Si_2$) and combinations thereof.

The silicon region 310 of the substrate 300 is typically protected by the block mask during the formation of the germanium containing region 320 of the substrate 300. Following formation of the germanium containing region 320, the block mask that is present over the silicon region 310 of the semiconductor substrate may be removed. In one embodiment, the silicon region 310 of the semiconductor substrate is free of germanium. In one embodiment, the silicon region 310 is comprised of greater than 99% silicon, e.g., the silicon region 310 may be composed of 100% silicon.

In one embodiment, the germanium containing region 320 may be composed of silicon germanium having a germanium content that is greater than 25 at. %, and a silicon content that is less than 75 at. %. In another embodiment, the germanium containing region 320 may have a germanium content that is greater than 50 at. %, and a silicon content that is less than 50 at. %. In another embodiment, the germanium-containing region 320 may be substantially 100 at. % germanium. For example, the germanium containing region 320 may have a germanium content that is greater than 99 at. %. In another example, the germanium containing region 320 may have a germanium content that is 100 at. %. In one embodiment, the thickness of the germanium containing region 320 may range from 10 µm to 1 mm. In another embodiment, the thickness of the germanium containing region 320 may range from 150 µm to 700 µm.

Figure 10:
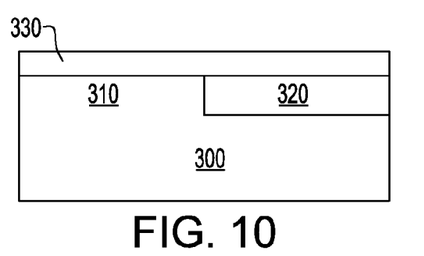
FIG. 10 is a side cross-sectional view depicting depositing a first silicon oxide layer by chemical vapor deposition on an upper surface of the silicon region and the germanium containing region of the substrate depicted in FIG. 9, in accordance with one embodiment of the present disclosure.

In step 160 of the process flow depicted in FIG. 8, a first silicon oxide layer 330 is deposited by chemical vapor deposition on an upper surface of the silicon region 310 and the germanium containing region 320 of the substrate 300, as depicted in FIG. 10. The chemical vapor deposition process for forming the first silicon oxide layer 330 may be selected from the group consisting of Atmospheric Pressure CVD (APCVD), Low Pressure CVD (LPCVD) and Plasma Enhanced CVD (EPCVD), Metal-Organic CVD (MOCVD) and combinations thereof. The thickness of the first silicon oxide layer 330 may have a thickness ranging from 0.1 nm to 7 nm. In another embodiment, the thickness of the first silicon oxide layer 330 may have a thickness ranging from 0.2 nm to 0.3 nm. In one embodiment, the thickness of the first silicon oxide layer 330 is uniform across the entire width of the substrate 300.

Figure 11:
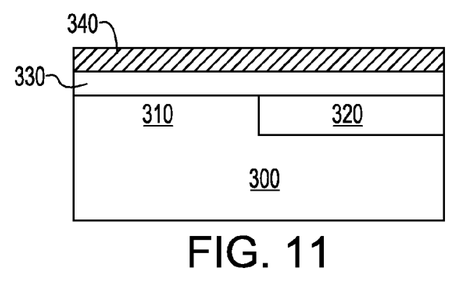
FIG. 11 is a side cross-sectional view depicting depositing a second silicon oxide layer on the first silicon oxide layer by atomic layer deposition, in accordance with one embodiment of the present disclosure.

In step 170 of the process flow depicted in FIG. 8, a second silicon oxide layer 340 is deposited on the first silicon oxide layer 330 by atomic layer deposition, as depicted in FIG. 11. The second silicon oxide layer 340 may be deposited using a high temperature atomic layer deposition process as described with reference to the flow chart depicted in FIG. 1.

In another embodiment, the second silicon oxide layer 340 may be deposited by atomic layer deposition using an ammonia containing bake, as described above with reference to FIG. 6. In yet another embodiment, the second silicon oxide layer 340 may be deposited by atomic layer deposition using a nitrogen containing anneal, as described above with reference to FIG. 7. The thickness of the second silicon oxide layer 340 may range from 0.1 nm to 0.8 nm. In another embodiment, the thickness of the second silicon oxide layer 340 may range from 0.2 nm to 0.35 nm. In one embodiment, the thickness of the second silicon oxide layer 340 is uniform across the entire width of the substrate 300.

Figure 12:
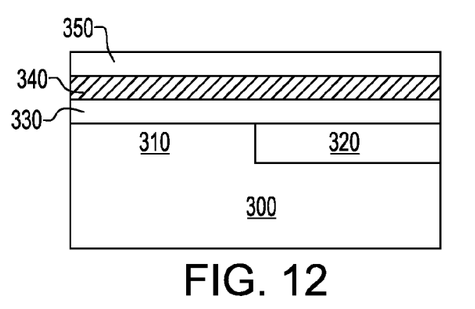
FIG. 12 is a side cross-sectional view depicting forming a high-k gate dielectric layer atop the second silicon oxide layer, in accordance with one embodiment of the present disclosure.

In step 180 of the process flow depicted in FIG. 8, a high-k gate dielectric layer 350 is formed atop the second silicon oxide layer 340, as depicted in FIG. 12. The high-k gate dielectric layer 350 that is depicted in FIG. 12 is similar to the high-k gate dielectric layer 8 that is described above with reference to FIGS. 1 and 4. Therefore, the description of the high-k gate dielectric layer 8 depicted in FIG. 4, is suitable for the high-k gate dielectric layer 350 that is depicted in FIG. 12.

Figure 13:
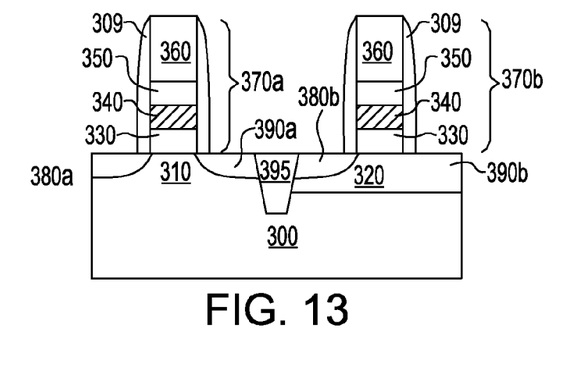
FIG. 13 is a side cross-sectional view depicting forming a first gate structure on a first channel portion of the silicon containing region of the substrate and a second gate structure on a second channel portion of the germanium containing region, and forming source and drain regions on opposing sides of the first and second channel region, in accordance with one embodiment of the present disclosure.

In step 190 of the process flow depicted in FIG. 8, a first gate structure 370a is formed on a first channel portion of the silicon region 310 of the substrate 300 and a second gate structure 370b is formed on a second channel portion of the germanium containing region 320 of the substrate 300, as depicted in FIG. 13. The first gate structure 370a and second gate structure 370b each include at least one gate conductor 360 on an upper surface of a dielectric stack comprised of a portion of the high-k gate dielectric layer 350, a portion of the second silicon oxide layer 340, and a portion of the first silicon oxide layer 330. The at least one gate conductor 360, the first gate structure 370a, and the second gate structure 370b that are formed in the process flow depicted in FIG. 8 is similar to the at least one gate conductor 11 and the gate structure 9 that are described above for the process flow that is depicted in FIG. 1. Therefore, the above description of the at least one gate conductor 11 and the gate structure 9 with reference to FIGS. 1 and 5 are suitable for the at least one gate conductor 360, the first gate structure 370a, and the second gate structure 370b that are referenced in the process flow depicted in FIG. 8, and depicted in FIG. 13. Spacers 309 may be present adjacent to the first gate structure 370a and the second gate structure 370b.

In step 200 of the process flow depicted in FIG. 8, a first source region 380a and a first drain region 390a are formed on opposing sides of the first channel in the silicon region 310 of the substrate 300, and second source region 380b and second drain region 390b are formed on opposing sides of the second channel in the germanium containing region 320 of the substrate 300, as depicted in FIG. 13. The source regions 380a, 380b and drain regions 390a, 390b formed in the process flow depicted in FIG. 8 are similar to the source region 13 and drain region 14 that are described above for the process flow that is depicted in FIG. 1. Therefore, the above description of the source region 13 and drain region 14 with reference to FIGS. 1 and 5 is suitable for the source regions 380a, 380b and drain regions 390a, 390b that are referenced in the process flow depicted in FIGS. 8 and 13. In one embodiment, the first source region 380a and first drain region 390a are doped to an n-type conductivity, and the second source region 380b and second drain region 390b are doped to a p-type conductivity. The dopant that provides the conductivity type of the source regions 380a, 380b and drain regions 390a, 390b may be ion implanted into the silicon region 310 and the germanium containing region 320 of the substrate 300. Selective ion implantation may be provided by forming a block mask (not shown) over the region of the substrate 300 that is to be protected from being implanted.

In some embodiments, a trench isolation region 395 may be provided separating the silicon region 310 of the substrate 300 from the germanium containing region 320 of the substrate 300. The trench isolation region 395 may be formed by etching a trench in the substrate 300 utilizing a dry etching process, such as reactive-ion etching (RIE) or plasma etching. Chemical vapor deposition or another like deposition process is used to fill the trench with oxide grown from tetraethylorthosilicate (TEOS) precursors, high-density oxide or another like trench dielectric material. The trench isolation region 395 may be formed prior to the formation of the semiconductor devices that are present in the silicon region 310 and the germanium containing region 320 of the substrate 300.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor device comprising:
   forming a passivation layer comprised of silicon germanium oxide on a surface of a germanium containing substrate;
   depositing a silicon oxide layer on the passivation layer utilizing atomic layer deposition (ALD) at a deposition temperature ranging from 375° C. to 450° C.;
   forming a high-k gate dielectric layer on the silicon oxide layer;
   forming a gate structure on a channel portion of the germanium containing substrate, wherein the gate structure includes at least one gate conductor on an upper surface of a dielectric stack comprised of a portion of the high-k gate dielectric layer and a portion of the silicon oxide layer; and
   forming a source region and a drain region on opposing sides of the channel portion of the germanium containing substrate,
   wherein during the forming of the passivation layer, germanium oxide is substantially removed from the surface of the germanium containing substrate so that the silicon oxide layer formed on the passivation layer has a substantially uniform thickness.

2. The method of claim 1, wherein the germanium containing substrate is silicon germanium comprising greater than 25% germanium.

3. The method of claim 1, wherein the germanium containing substrate comprises greater than 99% germanium.

4. The method of claim 1, wherein the atomic layer deposition (ALD) of the silicon oxide layer comprises a deposition precursor selected from the group consisting of vinyl-trimethoxysilane (VTMOS), trivinylmethoxysilane (TVMOS), tetrakis(dimethylamino)silane (TKDMAS), tris(dimethylamino)silane (TDMAS), (N,N Dimethylaminotrimethylsilane) DMATMS, BTBAS (Bis(TertiaryButylamino Silane) and combinations thereof.

5. The method of claim 1, wherein the silicon oxide layer comprises a silicon content ranging from 25% to 30% and an oxygen content ranging from 70% to 75%.

6. The method of claim 1, wherein the forming of the high-k gate dielectric layer on the silicon oxide layer comprises chemical vapor deposition (CVD) or atomic layer deposition.

7. The method of claim 1, wherein the passivation layer is formed by atomic layer deposition at a deposition temperature ranging from 375° C. to 450° C.

8. The method of claim 1, wherein the passivation layer has a thickness ranging from 0.1 to 0.5 nm.

9. The method of claim 1, wherein the thickness of the silicon oxide layer has a 1 sigma non-uniformity of less than 0.2 Å.

10. A method of forming a semiconductor device comprising:
passivating a deposition surface of a germanium containing substrate with an ammonia containing prebake, wherein the ammonia containing prebake forms a silicon nitride layer on the deposition surface of the germanium containing substrate;
depositing a silicon oxide layer by atomic layer deposition on the silicon nitride layer of the deposition surface;
forming a high-k gate dielectric layer atop the silicon oxide layer;
forming a gate structure on a channel portion of the germanium containing substrate, wherein the gate structure includes at least one gate conductor on an upper surface of a dielectric stack comprised of a portion of the high-k gate dielectric layer and a portion of the silicon oxide layer; and
forming a source region and a drain region on opposing sides of the channel portion of the germanium containing substrate,
wherein the ammonia containing prebake removes germanium oxide substantially from the deposition surface of the germanium containing substrate so that the silicon oxide layer formed on the silicon nitride layer has a substantially uniform thickness.

11. The method of claim 10, wherein the passivating of the deposition surface of the germanium containing substrate with the ammonia containing prebake comprises substantially no oxygen and a temperature ranging from 350° C. to 850° C.

12. The method of claim 10, wherein the passivating of the deposition surface of the germanium containing substrate with the ammonia containing prebake comprises treating the deposition surface with a gas flow comprised of 100% ammonia gas ($NH_3$).

13. The method of claim 10, wherein the silicon nitride layer comprises 90% to 95% silicon, and 5% to 10% nitride.

14. The method of claim 10, wherein the atomic layer deposition (ALD) of the silicon oxide layer comprises a deposition precursor selected from the group consisting of vinyltrimethoxysilane (VTMOS), trivinylmethoxysilane (TVMOS), tetrakis(dimethylamino)silane (TKDMAS), tris(dimethylamino)silane (TDMAS), (N,N Dimethylaminotrimethylsilane) DMATMS, BTBAS (Bis(TertiaryButylamino Silane) and combinations thereof.

15. The method of claim 10 wherein the atomic layer deposition (ALD) of the silicon oxide layer comprises a deposition temperature ranging from 20° C. to 600° C.

16. The method of claim 10, wherein the silicon nitride layer has a thickness ranging from 0.1 to 0.5 nm.

17. The method of claim 10, wherein the thickness of the silicon oxide layer has a 1 sigma non-uniformity of less than 0.2 Å.

18. A method of forming a semiconductor device comprising:
passivating a deposition surface of a germanium containing substrate with a nitrogen containing anneal, wherein the nitrogen containing anneal forms a silicon oxynitride layer on the deposition surface of the germanium containing substrate;
depositing a silicon oxide layer by atomic layer deposition (ALD) on the silicon oxynitride layer of the deposition surface;
forming a high-k gate dielectric layer atop the silicon oxide layer;
forming a gate structure on a channel portion of the germanium containing substrate, wherein the gate structure includes at least one gate conductor on an upper surface of a dielectric stack comprised of a portion of the high-k gate dielectric layer and a portion of the silicon oxide layer; and
forming source and drain regions on opposing sides of the channel portion of the germanium containing substrate,
wherein the nitrogen containing anneal removes germanium oxide substantially from the deposition surface of the germanium containing substrate so that the silicon oxide layer formed on the silicon oxynitride layer has a substantially uniform thickness.

19. The method of claim 18, wherein the passivating the deposition surface of a germanium containing substrate with the nitrogen containing anneal comprises an annealing atmosphere of nitrous oxide ($N_2O$) gas.

20. The method of claim 19, wherein the nitrogen containing anneal comprises a temperature ranging from 20° C. to 400° C.

21. The method of claim 18, wherein the silicon oxynitride layer comprises 20% to 30% silicon, 40% to 60% oxygen and 2% to 3% nitrogen.

22. The method of claim 18, wherein the silicon oxynitride layer has a thickness ranging from 0.5 to 1 nm.

23. The method of claim 18, wherein the thickness of the silicon oxide layer has a 1 sigma non-uniformity of less than 0.2 Å.

24. A method of a semiconductor device comprising:
providing a substrate including a silicon region and a germanium containing region;
depositing a first silicon oxide layer by chemical vapor deposition on an upper surface of the silicon region and the germanium containing region of the substrate;
depositing a second silicon oxide layer on the first silicon oxide layer by atomic layer deposition, the second silicon oxide layer having a substantially uniform thickness across an entire width of the substrate;
forming a high-k gate dielectric layer atop the second silicon oxide layer;
forming a first gate structure on a first channel portion of the silicon containing region of the substrate and a second gate structure on a second channel portion of the germanium containing region, wherein the first and second gate structures each include at least one gate conductor on an upper surface of a dielectric stack comprised of a portion of the high-k gate dielectric layer, a portion of the second silicon oxide layer and a portion of the first silicon oxide layer; and
forming a source region and a drain region on opposing sides of the first and second channel portions.

25. The method of claim 24, wherein the depositing of the second silicon oxide layer with atomic layer deposition (ALD) comprises a deposition temperature ranging from 375° C. to 450° C.

26. The method of claim 24 further comprising passivating the first silicon oxide layer with a nitrogen anneal or an ammonia bake.

* * * * *